(12) United States Patent
Nagashima et al.

(10) Patent No.: US 7,063,984 B2
(45) Date of Patent: Jun. 20, 2006

(54) LOW TEMPERATURE DEPOSITION OF COMPLEX METAL OXIDES (CMO) MEMORY MATERIALS FOR NON-VOLATILE MEMORY INTEGRATED CIRCUITS

(75) Inventors: Makoto Nagashima, Nishi-Tokyo (JP); Darrell Rinerson, Cupertino, CA (US); Steve K. Hsia, San Jose, CA (US); Larry Matheny, Fremont, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 10/387,773

(22) Filed: Mar. 13, 2003

(65) Prior Publication Data

US 2004/0180542 A1 Sep. 16, 2004

(51) Int. Cl.
*H01L 21/00* (2006.01)
(52) U.S. Cl. .............. 438/3; 438/240; 204/298.12; 204/298.26
(58) Field of Classification Search .............. 438/3, 438/240; 204/298.12, 298.26, 298.06, 298.09
See application file for complete search history.

(56) References Cited

U.S. PATENT DOCUMENTS

| 5,310,990 | A  | * | 5/1994  | Russell et al. ......... 219/121.69 |
| 5,667,650 | A  |   | 9/1997  | Face |
| 6,077,406 | A  | * | 6/2000  | Kawakubo et al. ..... 204/298.12 |
| 6,204,139 | B1 |   | 3/2001  | Liu et al. |
| 6,294,420 | B1 | * | 9/2001  | Tsu et al. ................... 438/239 |
| 6,498,097 | B1 | * | 12/2002 | Park et al. .................. 438/686 |
| 6,533,906 | B1 | * | 3/2003  | Kawakubo et al. ..... 204/192.22 |
| 6,537,830 | B1 | * | 3/2003  | Arita et al. ..................... 438/3 |
| 6,674,110 | B1 | * | 1/2004  | Gnadinger .................. 257/295 |
| 6,693,821 | B1 | * | 2/2004  | Hsu et al. ................... 365/158 |
| 6,815,744 | B1 | * | 11/2004 | Beck et al. ................. 257/295 |
| 2003/0148565 | A1 | * | 8/2003 | Yamanaka .................. 438/200 |
| 2004/0160818 | A1 | * | 8/2004 | Rinerson et al. ........... 365/171 |

OTHER PUBLICATIONS

Liu, et al., Electric-pulse-induced reversible resistance change effect in magnetoresistive films. Applied Physics Letters vol. 76, No. 19, May 8, 2000.

Liu et al., A New Concept for Non-Volatile Memory: The Electric-Pulse Induced Resistive Change Effect in Colossal Magnetoresistive Thin Films, NVMTS Nov. 7, 2001.

Beck et al., Reproducible switching effect in thin Oxide films for memory applications. Applied Physics Letters vol. 77, No. 1, Jul. 3, 2000.

(Continued)

*Primary Examiner*—Hsien-Ming Lee

(57) ABSTRACT

A memory fabrication apparatus includes a pair of targets arranged so as to be spaced apart from one another within a closed vacuum vessel, each target of said pair of targets having a sputtering surface facing the sputtering surface of the other target of said pair of targets; and substrate holder adapted to receive facing target sputtering a CMO material on an electrode.

36 Claims, 13 Drawing Sheets

Perform deposition on a conductive electrode (12)

Deposit CMO at low temperature CMO where the in-situ deposited material is in crystalline form (14)

OTHER PUBLICATIONS

Watanable et al., Current-driven insulator-conductor transistion and nonvolatile memory in Chromium-doped SrTiO3 single Crystals. Applied Physics Letters vol. 78, No. 23, Jun. 4, 2001.

Rossel et al., Electric Current distribution across a metal-insulator-metal structure during bistable switching. Journal of Applied Physics vol. 90, No. 6. Sep. 15, 2001.

Product Brochure from Japan Steel Works.

Westerheim et al., Relation between electrical properties and microstructure of YBaCuO thin films deposited by single-target off-axis sputtering, J. Appl. Phys. 750, Jan. 1, 1994.

Rao et al., Uniform deposition of YbaCuO thin films over an 8-inch diameter area by a 90 deg. Off-axis sputtering technique, Appl. Phys. Lett. 69(25), Dec. 16, 1996.

Inoue, et al., Sputtering Process Design of PZT capacitors for stable FeRAM operation, IEEE 1998.

Li et al., Preferred orientation and ferroelectric properties of lead zirconate titanate thin films, Thin Solid Films 375 (2000) 91-94.

Li et al., Chacterization of lead zirconate titante thin films deposited at low temperature by reactive facing target sputtering. Thin Solid Films 375 (2000) 267-270.

Li et al., Preparation and characterization of highly oriented Pb(Zr, Ti)O3 thin films with seeding titanium layer deposited at low temperature by facing target sputtering. Vacuum 59 (2000) 800-805.

Inoue et al., Low thermal-budget fabrication of sputtered PZT capacitor on multilevel interconnects for embedded FeRAM, IEEE 2000.

Lung et al., Low Temperature Epitaxial Growth of PZT on Conductive Perovskite LaNiO3 electrode for embedded capacitor over interconnect (COI) FeRAM application, IEEE 2001.

Seol et al., Low temperature crystallization induced by excimer laser irradiation of SrBi2Ta2O9 films, Materials Research Society 2001.

* cited by examiner

Perform deposition on a conductive electrode (12)

Deposit CMO at low temperature CMO where the in-situ deposited material is in crystalline form (14)

FIG. 1A deposit CMO memory material on an electrode (52)

laser anneal the CMO memory material by one or more short pulses of laser energy (54)

LOW TEMPERATURE DEPOSITION OF COMPLEX METAL OXIDES (CMO) MEMORY MATERIALS FOR NON-VOLATILE MEMORY INTEGRATED CIRCUITS

BACKGROUND

This invention relates to methods and apparatus for providing high density, high storage capacity, low power, and nonvolatile memory devices.

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use electrical charge to store information. Generally, flash memory devices can offer the same density as DRAM devices. Current DRAM technology offers high access speed that high performance computer systems demand. However, DRAM devices are volatile, and the memory content is lost when power is removed. Flash memory is non-volatile and has the capability of "remembering" the stored data even when power is removed. Because of its non-volatily and low power consumption in standy mode, Flash memories have increasingly be used in portable applications such as Personal Digital Assistants (PDAs), digital cameras and cellular phones. Flash memories, however, have a slow data program time and can only be erased one large block at a time. Therefore there is a need for a non-volatile, low power, fast program/erase, writable a byte at a time, memory.

A new type of memory device involves spin electronics, which combines semiconductor technology and magnetics. As discussed in U.S. Pat. No. 6,490,194 to Hoenigschmid, the spin of an electron, rather than the charge, is used to indicate the presence of a "1" or "0". One such spin electronic device is a magnetic random-access memory (MRAM). Such device achieves non-volatility and fast access time, but has a relatively high current consumption.

Recently, technical papers have been published on the use of certain complex metal oxides for potential use in high density memory devices. For example, U.S. Pat. No. 6,204,139 discusses the use of pulse laser deposited perovskite materials that can then work as switching devices. Additionally, three technical papers published by the IBM Zurich Research Center discuss the use of metal oxide material for memory applications. These papers discuss the use of pulse laser deposition and the use of very high substrate temperatures during deposition on top of YBCO or similar substrates to achieve single crystal perovskite material. However, YBCO is a material that is not suitable for integration in a semiconductor process, and PLD (pulsed laser deposition) is a deposition method that is not suitable for IC production. Additionally, conventional deposition techniques are done at high temperature (about 800° C.). This temperature is too high for IC fabrication, particularly after one or more metal layers have been deposited.

SUMMARY

In one aspect, a semiconductor fabrication process includes providing at least a pair of facing targets arranged so as to be spaced apart from one another, each target of said pair of targets having a sputtering surface facing the sputtering surface of the other target of said pair of targets; and sputtering a CMO material on an electrode.

Implementations of the above process may include one or more of the following. The CMO material can be a polycrystalline structure. The electrode can be metal, conductive metal oxide, or diffusion. The electrode can also be a plug. The CMO material can be deposited by sputtering. The CMO material can be a perovskite or a non-perovskite. The CMO material can be deposited at a temperature below 375° C. The process can include annealing the CMO memory material using a laser such as an excimer laser.

In another aspect, a memory fabrication apparatus includes a pair of targets arranged so as to be spaced apart from one another within a closed vacuum vessel, each target of said pair of targets having a sputtering surface facing the sputtering surface of the other target of said pair of targets; and a substrate holder adapted to receive facing target sputtering (FTS) a CMO material on an electrode.

Implementations of the apparatus may include one or more of the following. The FTS unit deposits at a temperature below 375° C. An annealer having a laser adapted to scan the surface of the CMO layer can be used. The laser may be an excimer laser. The CMO material can be deposited at a temperature below 375° C. The CMO material can also be deposited at a temperature below 550° C. The electrode can be metal, conductive metal oxide, or diffusion. The electrode can also be a plug. The CMO material after annealing can include an array of memory cells capable of storing at least a Megabit of information, each memory cell including a memory plug that includes a memory element that switches from a first resistance state to a second resistance state upon application of a first write voltage of a first polarity and reversibly switches from the second resistance state to the first resistance state upon application of a second write voltage of polarity opposite to the first polarity; and peripheral circuitry that is capable of supplying the first write voltage and the second write voltage to a memory cell or a group of memory cells and is capable of determining the resistance states of a memory cell or a group of memory cells. The CMO material structure can be crystalline having a small grain size, for example the grain size can be approximately 0.1 microns or less, after annealing.

Advantages of the memory device may include one or more of the following. The system can fabricate memory devices with fast read and write and no wear out, and storage memory (for data and/or program store) that is non-volatile and the ability to read many times without significant data degradation. In addition, the storage memory also achieves considerable cost/bit reductions as compared to existing memories. The memory device or cell may be used as an EEPROM of Flash Memory cell, usually used for non-volatile storage. Thus, the storage memory can be used as replacement memory for PROM (programmable read-only memory), EPROM (electrically programmable read-only memory), EEPROM (electrically erasable programmable read-only memory), FRAM (Ferroelectric Random Access Memory), NVRAM (Non-Volatile Random Access Memory), Bubble Memory, and Flash Memory. The memory can also be used in programmable switches such as field programmable gate arrays (FPGAs).

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

DESCRIPTION

In order that the manner in which the above-recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 1A–1B show an exemplary process 10 for performing low temperature deposition of a CMO material.

DESCRIPTION

Figure 2:
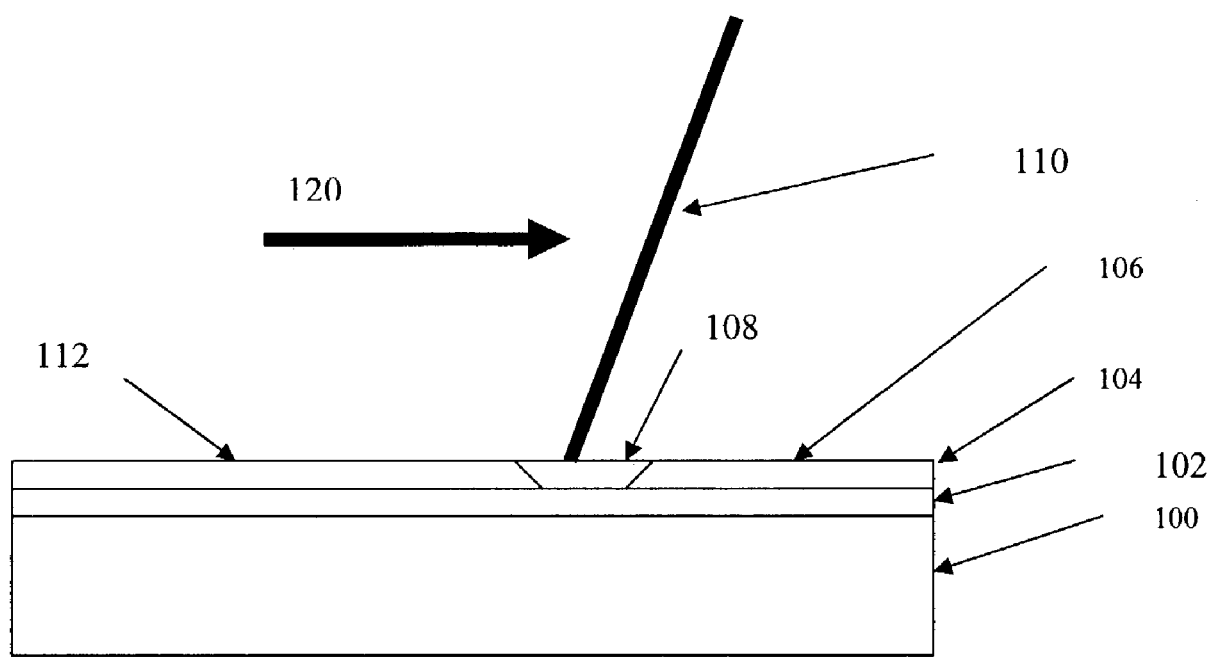
FIG. 2 shows an exemplary cross-sectional view of a substrate in conjunction with the laser annealing operation of FIGS. 1A–1B.

Referring now to the drawings in greater detail, there is illustrated therein structure diagrams for a display controller and logic flow diagrams for processes a computer system will utilize to render images on a display panel, as will be more readily understood from a study of the diagrams.

FIGS. 1A–1B show an exemplary process 10 for performing low temperature deposition of a CMO material. The CMO material generally has an amorphous or polycrystalline perovskite structure. In one aspect, the CMO material includes two or more metals, the metals being selected from the group consisting of transition metals, alkaline earth metals and rare earth metals. The CMO material can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr). The titanates and zirconates can also be doped with chromium. In another aspect, $MnO_3$, when combined with the rare earth metals La, Pr or some combination thereof and the alkaline earth metals Ca, Sr or some combination thereof can produce a particularly effective CMO material for use in a resistive memory element.

The top electrode material can include precious metal (e.g. Au, Pt, Ag, Pt, Pd, Ir, Ru, among others), refractory metal (e.g. W, Mo, Co, Ta, among others) or other suitable metal such as Al. The top electrode material can include conductive metal oxide (e.g. LaNiO3, La SrCoO3, YBCO, RuO2, IrO2, SrRuO3, among others), silicide (PtSi2, WSi2, MoSi2, CoSi2, among others), binary barrier metal (TiN, TaN, TiW, MoN, WN, among others), and ternary barrier metal (TaSiN, TiAlN, TiSiN, RuTiN, RuTiO, CrTiN, among others)

Conductive metal oxides and ternary barrier metals are excellent candidates for protecting the underlying metal from being oxidized during PCMO deposition process and post-deposition annealing containing oxygen.

The CMO material is deposited after a conductive layer has been put down, or alternatively the CMO material can be deposited between layers of conductive materials including metal. This opens up many new device applications, such as a true cross-point memory array.

The process of FIG. 1 first performs a deposition on a conductive electrode (12) and then a low temperature CMO deposition is performed where the in-situ deposited material is in crystalline form (14). The electrode can be Pt or a conductive metal oxide rather than materials such as YBCO.

FIG. 1B shows a second process 50 for performing low temperature deposition of a CMO material. In this process, a laser is used to locally heat the CMO material to a temperature to crystallize the CMO material and then the material is allowed to cool down to ambient temperature. As the CMO memory material cools, it crystallizes into a highly ordered structure.

In this embodiment, the process 50 includes depositing the CMO memory material on an electrode (52). The CMO material can be deposited by a number of different methods: sputtering, MOCVD, and spin-on processing, among others. The temperature of deposition and other processing conditions are such that the material is deposited in an amorphous form. Each of these deposition methods can be used to deposit the CMO material that can be post deposition, laser annealed. For the purposes of laser annealing, any of these steps can be used. However, the CMO material cannot be deposited using pulse laser deposition since pulse laser deposition requires a very high substrate temperature during deposition and the exposure of ICs to such temperature would render many of their structures inoperable.

Next, the process 50 laser anneals the CMO memory material by one or more short pulses of laser energy (54). In one embodiment, after the deposition of a thin film layer of CMO memory material either by sputtering, MOCVD or spin on processing, the process 50 sweeps across the wafer using a computer controlled laser system such as a YAG or XeCl excimer laser, for example. In one embodiment, the XeCl laser outputs 200 mJ/cm$^2$ at a wavelength of 308 nm.

The laser spot size, laser energy, pulse duration, sweep rate, substrate temperature, ambient conditions and pressure are optimized by the processes of FIGS. 1A and 1B for achieving the best results. Other variables that are taken into consideration by the processes of FIGS. 1A and 1B include the material surface condition, material stoichiometry, film thickness, the thermal property of bottom electrode and material film, and annealing ambient, among others.

FIG. 2 shows an exemplary cross-sectional view of a substrate 100 in conjunction with the laser annealing operation 54. An electrode layer 102 is deposited at conventional processing temperature above the surface of the substrate 100. The electrode layer can be a metal layer, a conductive metal oxide layer, a diffusion layer, or a suitable structure such as a plug. Next, a CMO material layer 104 is deposited at a relatively low temperature (for example room temperature). The CMO memory material layer 104 is subsequently crystallized in a relatively confined region 108 by a high energy, short pulse of laser beam 110 moving in a direction 120 to scan the surface of the substrate 100 to treat regions of uncrystallized CMO material 106. As the laser beam 110 is either removed or moves on along direction 120, the CMO memory material 104 re-crystallizes into a highly ordered crystalline state at region 112.

In one embodiment, a predetermined angle of incidence of the laser beam 110 and the surface of the substrate 100 is selected to minimize damage to structures formed in the layer(s) underneath the CMO material 106. Also, for each laser beam wavelength, a predetermined energy level is selected to optimize energy absorption by the CMO material 106 and minimize overheating the material 106. In another embodiment, the substrate 100 can be preheated to optimize the laser annealing process.

Figure 3:
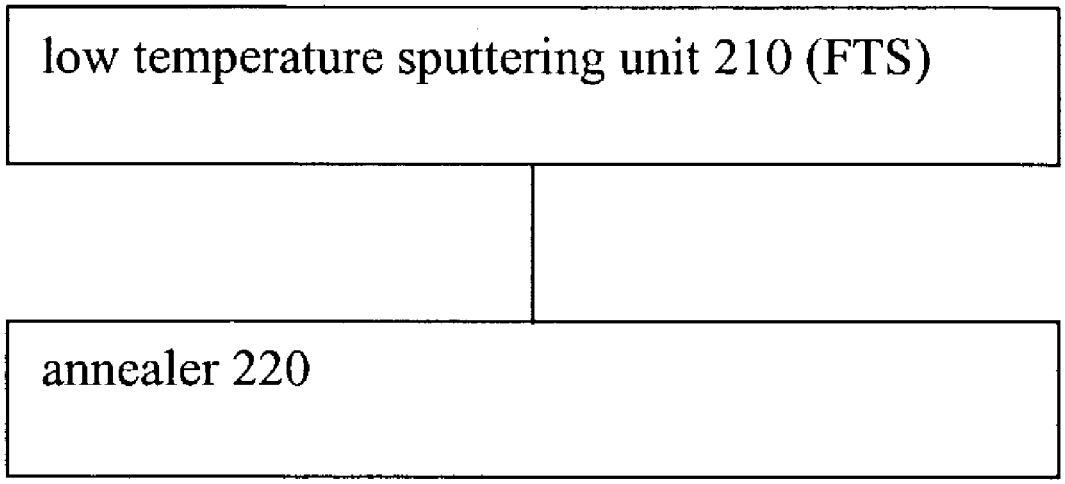
FIG. 3 shows one embodiment of an apparatus for fabricating semiconductor.

FIG. 3 shows one embodiment of an apparatus for fabricating semiconductor. The apparatus includes a low temperature sputtering unit 210 such as a facing target sputtering (FTS) unit for producing a CMO layer on a substrate; and an annealer 220 adapted to anneal the CMO layer. The annealer 220 can be a laser annealing unit such as a YAG laser or a XeCl laser. Post deposition laser annealing enables a low temperature deposition of the CMO material. The CMO material is deposited after a conductive electrode or a suitable metal layer has been put down, or to be deposited between layers of the conductive electrode or suitable metal. This opens up various new device applications, such as a true cross-point memory array.

In one embodiment, the low temperature sputtering unit 210 can include a vacuum vessel for defining therein a confined vacuum chamber, an air exhausting unit having a vacuum pump system to cause a vacuum via an outlet, and a gas supplying unit for introducing a preselected sputtering gas into the vacuum vessel via an inlet so that the introduced gas pressure within the vacuum vessel is maintained at a predetermined level. A pair of target portions are arranged to be in the vacuum vessel in such a manner that a pair of rectangular shape cathode targets face each other so as to define a predetermined space therebetween. A substrate holder supports a substrate at a position beside a space extending the outlet of the facing targets, and is arranged to be perpendicular to the planes of the targets, which are electrically connected to a electric power source to cause sputtering from the surfaces of the targets. Magnetic fields are then generated to cover vertically the outside of the space between facing target planes by the arrangement of magnets installed in touch with the backside planes of facing targets. Shield plates are used for maintaining sputtering plasma stably in a defined space between facing target planes while sputtering. The facing targets are used a cathode, and the shield plates are used as an anode, and the cathode/anode are connected to output terminals of a direct current (DC) power source. The vacuum vessel and the shield plates are also connected to the anode. Under pressure, sputtering plasma is formed in the space between the facing targets while power from the power source is applied. Since magnetic fields are generated around the peripheral area extending in a direction perpendicular to the surfaces of facing targets, highly energized electrons sputtered from surfaces of the facing targets are confined in the space between facing targets to cause increased ionized gases by collision in the space. The ionization rate of the sputtering gases corresponds to the deposition rate of thin films on the substrate, then, high rate deposition is realized due to the confinement of electrons in the space between the facing targets. The substrate is arranged so as to be isolated from the plasma space between the facing targets. Film deposition on the substrate is processed at a low temperature range due to a very small number of impingement of plasma from the plasma space and small amount of thermal radiation from the target planes. A typical facing target type of sputtering method has superior properties of depositing ferromagnetic materials at high rate deposition and low substrate temperature in comparison with a magnetron sputtering method.

In another embodiment, the low temperature sputtering unit 210 can be the plasma generating unit disclosed in U.S. Pat. No. 6,156,172 to Sadao Kadokura. This FTS system includes an arrangement for defining box-type plasma units supplied therein with sputtering gas mounted on outside wall-plates of a closed vacuum vessel; at least a pair of targets arranged to be spaced apart from and face one another within the box-type plasma unit, with each of the targets having a sputtering surface thereof; a framework for holding five planes of the targets or a pair of facing targets and three plate-like members providing the box-type plasma unit so as to define a predetermined space apart from the pair of facing targets and the plate-like members, which framework is capable of being removably mounted on the outside walls of the vacuum vessel with vacuum seals; a holder for the target having conduits for a coolant; an electric power source for the targets to cause sputtering from the surfaces of the targets; permanent magnets arranged around each of the pair of targets for generating at least a perpendicular magnetic field extending in a direction perpendicular to the sputtering surfaces of the facing targets; devices for containing the permanent magnets with target holders, removably mounted on the framework; and a substrate holder at a position adjacent the outlet space of the sputtering plasma unit in the vacuum vessel. The unified configuration composed of a cooling device for cooling both the backside plane of the targets and a container of magnets in connection with the framework improves the compactness of sputtering apparatus.

After deposition by the FTS unit, substrates are transported to the annealer 220 adapted to anneal the CMO layer. The annealer 220 can be a laser annealing unit such as a YAG laser or a XeCl laser.

In one embodiment, the laser can be a Japan Steel Work Thin Film Transistor (TFT) Annealing System marketed for low temperature poly-silicon TFT process. This system uses a XeCl laser with a beam length of up to 365 mm and a short axis of 0.4 mm. The long axis is the same as the diameter of the wafer. In this laser, the incident beam is perpendicular to the wafer surface. The grain size can be increased by increasing the incident angle of laser beam.

In another embodiment, the laser has a laser oscillator. The laser beam output from the laser oscillator is passed through an optical system with an optical element, such as a homogenizer. The optical system substantially homogenizes the distribution of intensity of the laser beam, and shapes the laser beam to a predetermined form of the beam radiation surface. Then, the laser beam is guided to and irradiates the substrates. To control the intensity of energy of a laser beam, part of the laser beam output from the laser oscillator is split by a semi-transparent mirror, and the intensity of energy of the split laser beam is detected. Based on the detection value, the intensity of energy of the laser beam output from the laser oscillator is controlled.

Figure 4A:
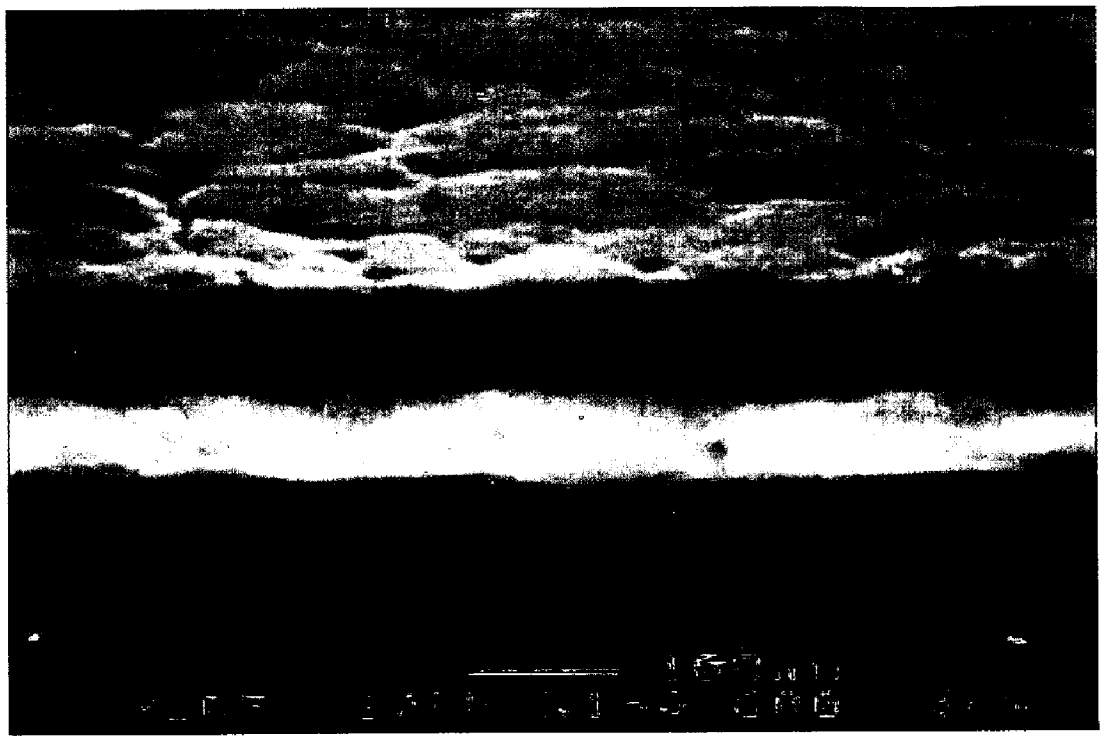
FIGS. 4A and 4B shows exemplary SEM graphs of fully crystallized PCMO film (800 A) after XeCl laser annealing in air with 200 mj/cm2 laser power.
Figure 4B:
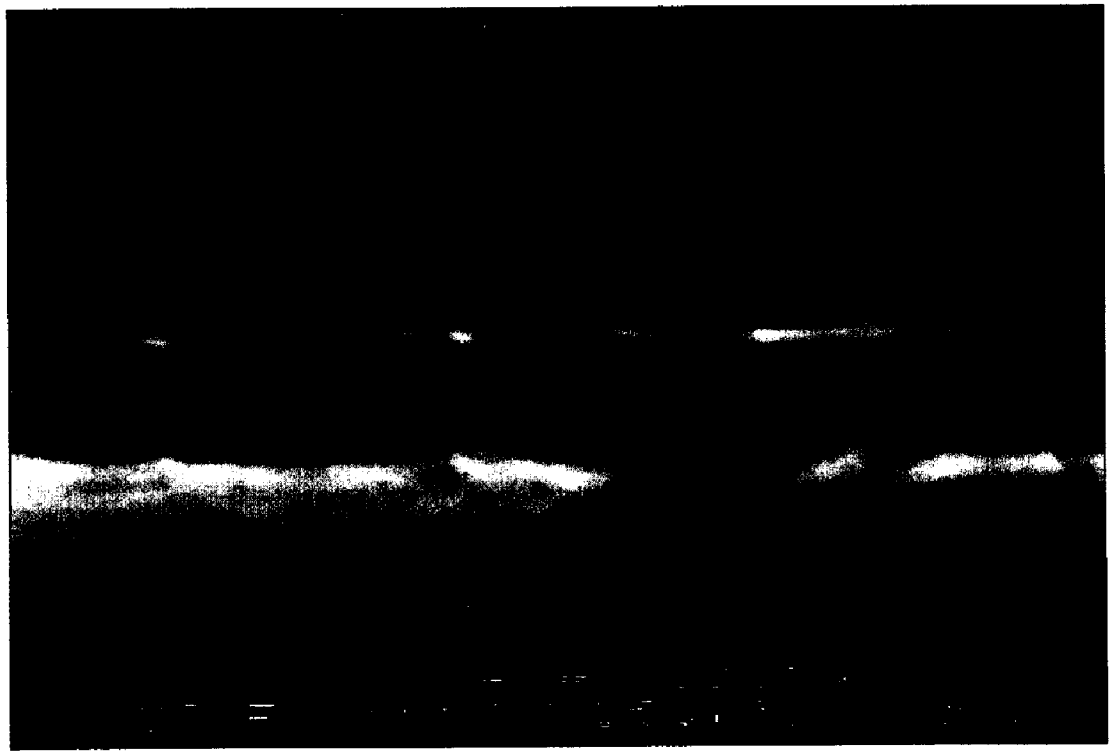

XeCl laser and YAG laser have been tested for PCMO crystallization. The difference between XeCl and YAG lasers is in laser wavelength (528 nm for YAG and 308 nm for XECl). In a low temperature PCMO crystallization test, PCMO films were deposited at 350° C. sputter temperature in proximally pure argon (argon+10% oxygen). The thickness of PCMO film ranged between 400A to 1000A. As shown in FIGS. 4A and 4B, PCMO was fully crystallized after XeCl laser annealing in air with 200 mj/cm$^2$ laser power.

In FIGS. 4A and 4B, the laser annealed PCMO film is textured and has very smooth surface, which is needed for achieving uniform resistance change in programming and erasing the memory cell. The film has a regular crystalline structure without crack and void. The CMO layer is crystallized by the local heating due to laser irradiation and the temperature is usually at a low temperature such as below 400° C. The process for forming the thin film requires a short time because of the film's thinness. Since both the deposition and the crystallization operations form crystalline thin film at a relatively low temperature, the process can be used to form an additional layer above conventionally formed layers without damaging elements that were previously formed using conventional deposition techniques. Thus, thin film structures can be formed above conventionally deposited structure to provide additional functionality, for example additional memory above conventionally formed logic or analog circuits. In contrast, conventional deposition techniques such as those reported by Daesig Kim in U.S. Pat. No. 6,333,066 shows a rough surface of the PZT film deposited by MOCVD on Pt electrode.

Figure 5:
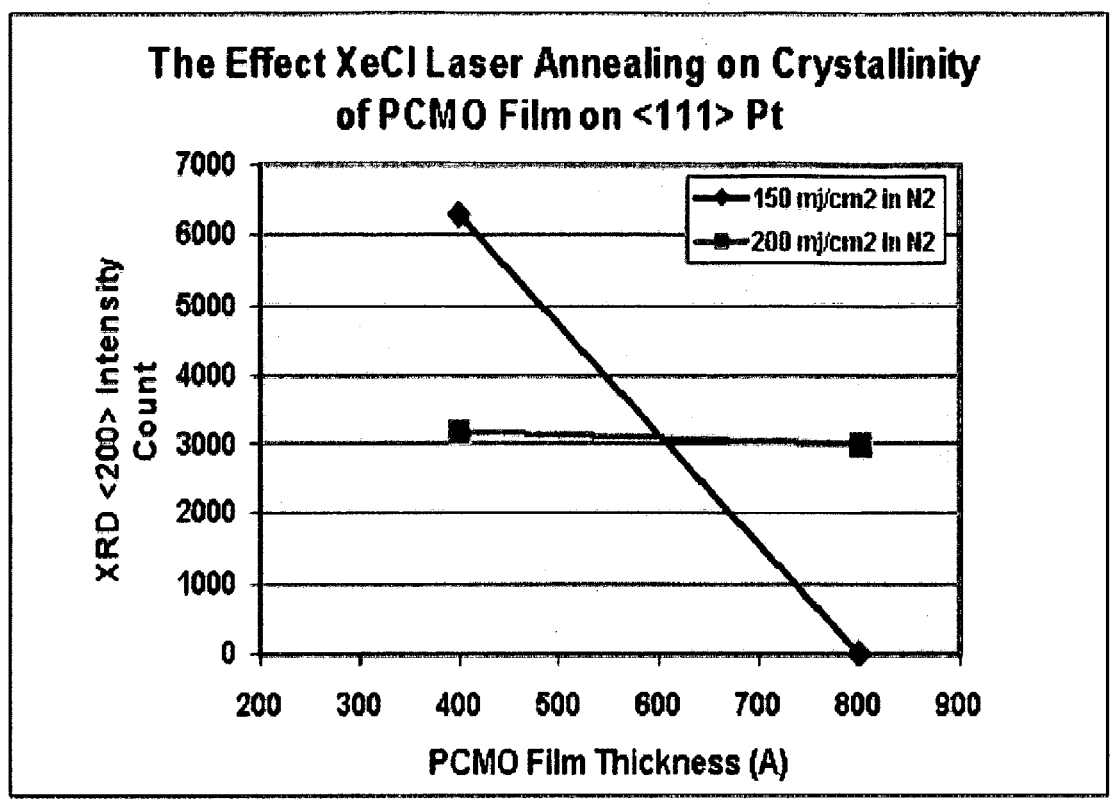
FIG. 5 shows an exemplary chart illustrating XRD intensity counts for <200>/<112> orientation.

Table 1 summarizes the result of an XRD analysis used to study the degree of crystallinity of PCMO film on <111> Pt bottom electrode and its preferred crystal orientation. The preferred PCMO orientation has been observed to be <200>/<112> with ~33 degree of 2θ angle. Laser power and annealing ambient N2 were varied versus air. Two different thicknesses of PCMO have been investigated: 400A and 800A. As shown in FIG. 5, a thicker PCMO film requires higher laser power for PCMO crystalline formation. When laser power is optimized, the degree of crystallinity is almost independent of PCMO thickness as shown in FIG. 5.

FIG. 5 shows an exemplary chart illustrating XRD intensity counts for <200>/<112> orientation.

Figure 6:
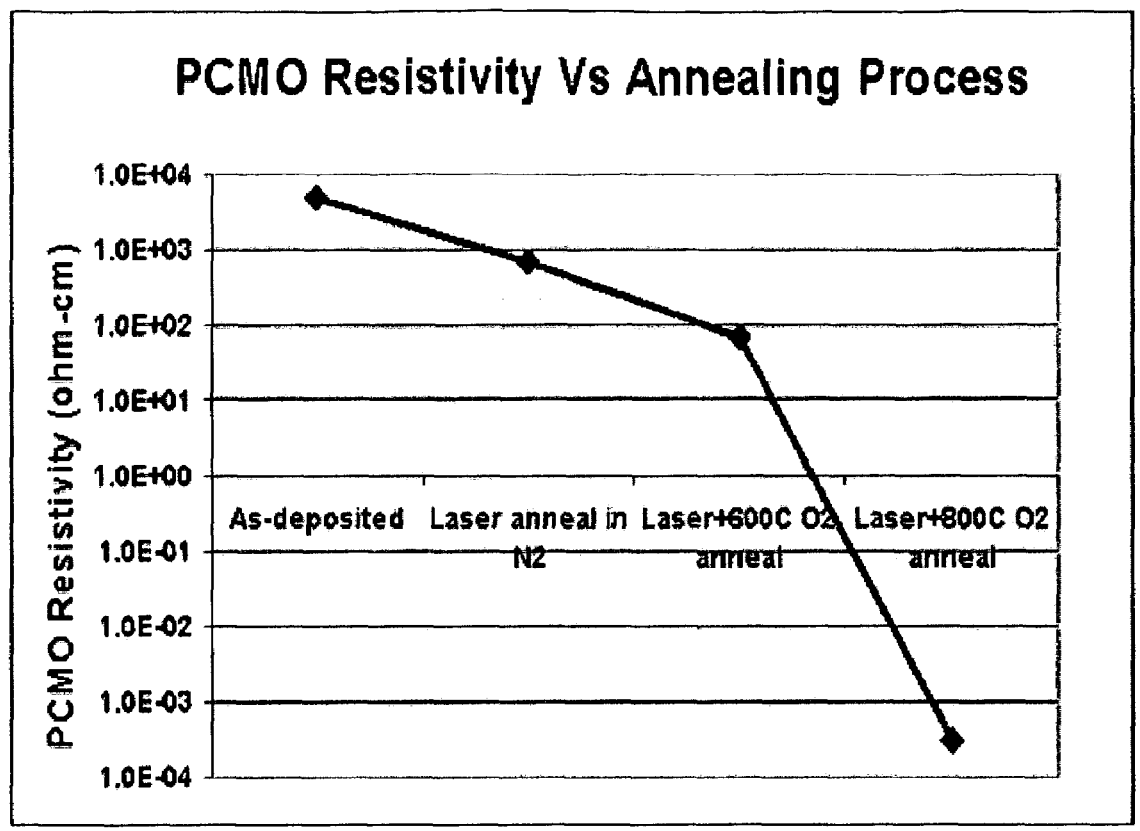
FIG. 6 shows a chart illustrating resistivity of XeCl laser crystallized PCMO film at $N_2$ ambient.

FIG. 6 shows a chart illustrating resistivity of XeCl laser crystallized PCMO film at N$_2$ ambient. The PCMO film was deposited on SiO$_2$ for accurate resistivity measurement. The resistivity of PCMO film was reduced by one order of magnitude after laser annealing in N$_2$ ambient for FTS sputtered PCMO film deposited at 350° C. sputter chuck temperature in pure N$_2$ ambient. As shown in FIG. 5, the resistivity of XeCl laser crystallized PCMO film at N$_2$ ambient is one tenth of as-sputtered PCMO film. The resistivity of PCMO film appears to be predominantly a function of oxygen concentration in the film. The crystallization itself has less of an effect on PCMO resistivity.

Figure 7A:
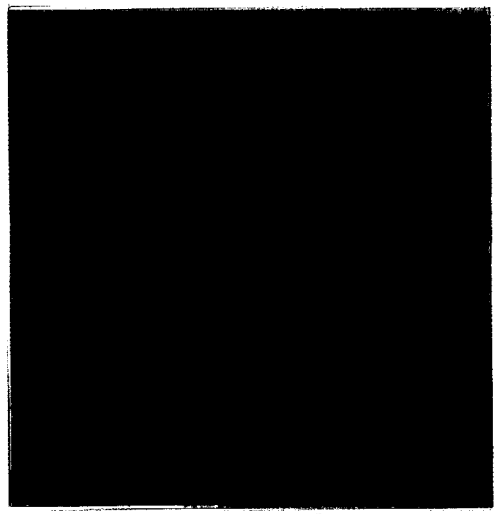
FIG. 7A–7B show surface photographs of 800 Å PCMO deposited on 1000 Å Pt after XeCl laser annealing in air with 200 mj/cm$^2$ and 400 mj/cm$^2$ power, respectively.
Figure 7B:
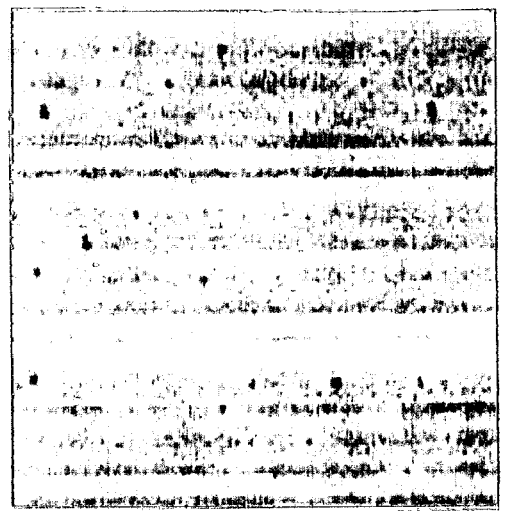
Figure 8:
FIG. 8 shows a surface photograph of 800 Å PCMO deposited on silicon after XeCl laser annealing in air with 500 mj/cm$^2$ laser power.

FIG. 7A–7B show surface photographs of 800 Å PCMO deposited on 1000 Å Pt after XeCl laser annealing in air with 200 mj/cm$^2$ and 400 mj/cm$^2$ power, respectively. The two photographs show significant PCMO peeling when the laser power is higher than 250 mj/cm$^2$ and when annealing is done in air. PCMO lifting may have been caused by the difference in thermal expansion between PCMO and the substrate material since laser irradiation can cause localized heating in the PCMO film. In the case of silicon substrate, no PCMO lifting was observed even after 500 mj/cm$^2$ laser irradiation in air as shown in FIG. 8, which shows a surface photograph of 800 Å PCMO deposited on silicon after XeCl laser annealing in air with 500 mj/cm$^2$ laser power. The thermal conductivity of silicon is 168 W/mK which is much higher than that of platinum, 72 W/mK, and the temperature in PCMO film on Pt substrate can be higher than that of PCMO film on silicon substrate. FIGS. 7A, 7B and 8 show that inert annealing ambient, N$_2$ or Ar, significantly minimized PCMO peeling. The addition of oxygen to the annealing ambient as in the case of annealing in air can cause volume change in manganites which could result in excessive mechanical stress in PCMO film.

Figure 9:
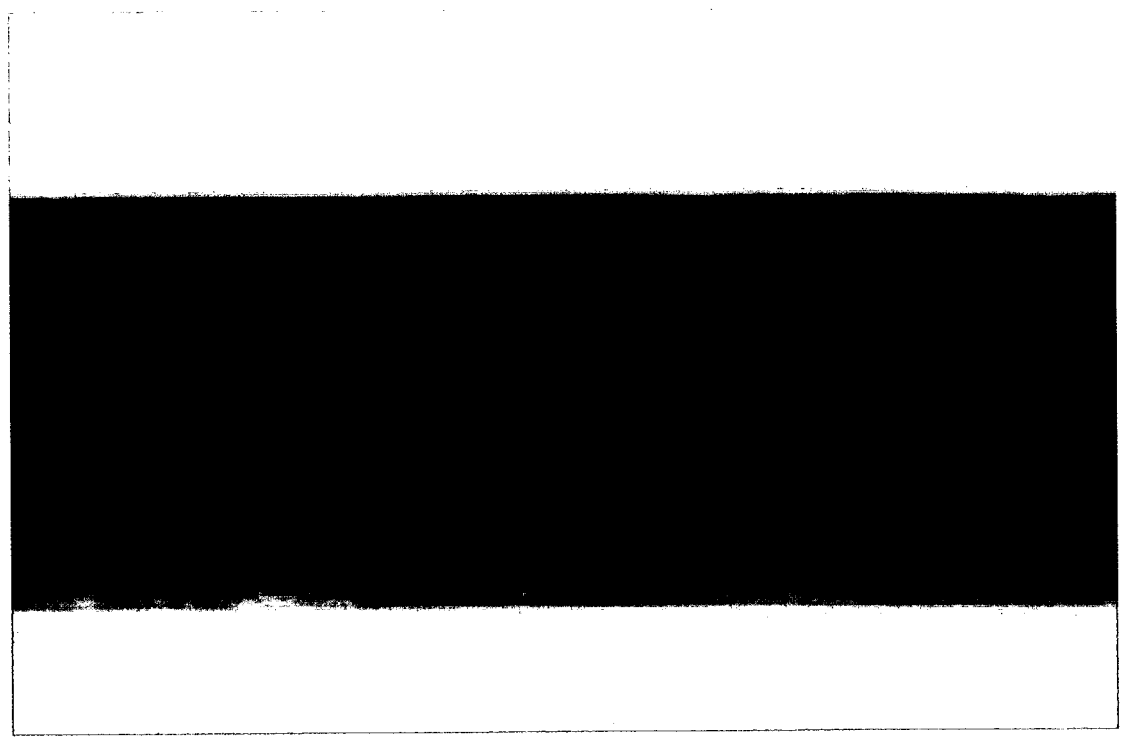
FIG. 9 shows a TEM micrograph of partially crystallized PCMO film after XeCl laser annealing in $N_2$ with 200 mj/cm$^2$ laser power.

FIG. 9 shows a TEM micrograph of partially crystallized PCMO film after XeCl laser annealing in N$_2$ with 200 mj/cm$^2$ laser power. The TEM micrograph of FIG. 9 shows the top PCMO layer as being crystallized while the bottom PCMO layer is still amorphous after XeCl laser annealing. This phenomenon may be caused by the local heating nature of laser annealing.

Figure 10A:
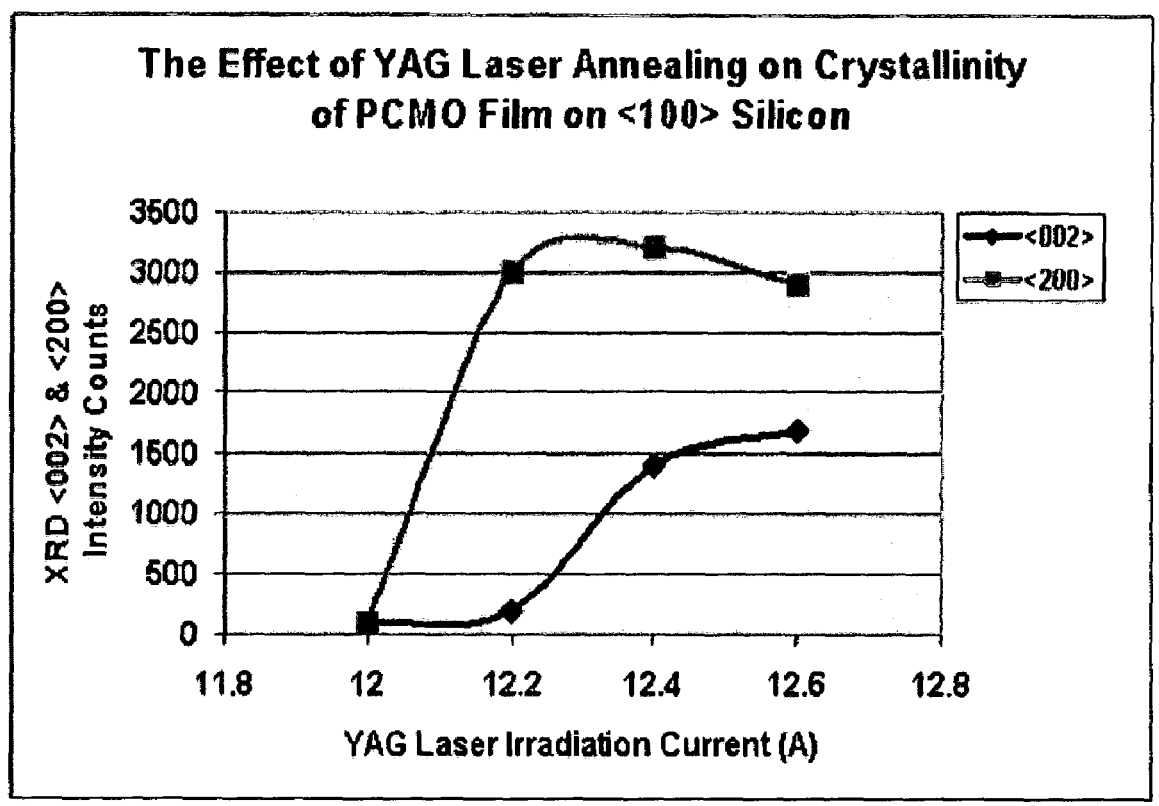
FIG. 10A shows the effect of YAG annealing on crystallinity of PCMO film on <100> silicon.

FIG. 10A shows the effect of YAG annealing on crystallinity of PCMO film. In a YAG laser experiment, instead of depositing 800A PCMO on <111> Pt FTS deposited PCMO film on <100> silicon substrate. According to FIG. 10, both <200>/<112> and <110>/<002> peaks coexist in PCMO

TABLE 1

XRD intensity counts vs. XeCl laser annealing conditions

| FTS Sputtering Condition | | | | | | Laser Anneal | | | XRD 2θ |
|---|---|---|---|---|---|---|---|---|---|
| Ar/O2 (sccm) | Working Press. (Pa) | Power/Transp. Speed (W/cm/min.) | Sub. Temp. (deg. C.) | Film Thickness | Sub. | Equip. | Gas | Power mj/cm2 | 33 <200> |
| 5/0.5 | 0.101 | 1,100/3 | 100 | 400 | Pt | XeCl | N2 | 150 | 6282 |
| 5/0.5 | 0.101 | 1,100/3 | 100 | 400 | Pt | XeCl | Air | 150 | 1050 |
| 5/0.5 | 0.101 | 1,100/3 | 100 | 400 | Pt | XeCl | N2 | 200 | 3200 |
| 5/0.5 | 0.101 | 1,100/3 | 100 | 800 | Pt | XeCl | Air | 200 | 6541 |
| 5/0.5 | 0.101 | 1,100/3 | 100 | 800 | Pt | XeCl | N2 | 150 | 0 |
| 5/0.5 | 0.101 | 1,100/3 | 100 | 800 | Pt | XeCl | N2 | 200 | 3000 |
| 5/0.5 | 0.101 | 1,100/3 | 100 | 800 | Pt | XeCl | Air | 180 | 2100 |
| 5/0.5 | 0.05 | 1,000/3 | 100 | 800 | Pt | XeCL | N2 | 190 | 132 | film after YAG laser anneal. This effect could be due to the <100> orientation of silicon substrate. The degree of crystallinity is also a function of irradiation current or laser power as XeCl laser annealing. The 2θ angle for <110>/<002> peak is approximately 23 degree.

Figure 10B:
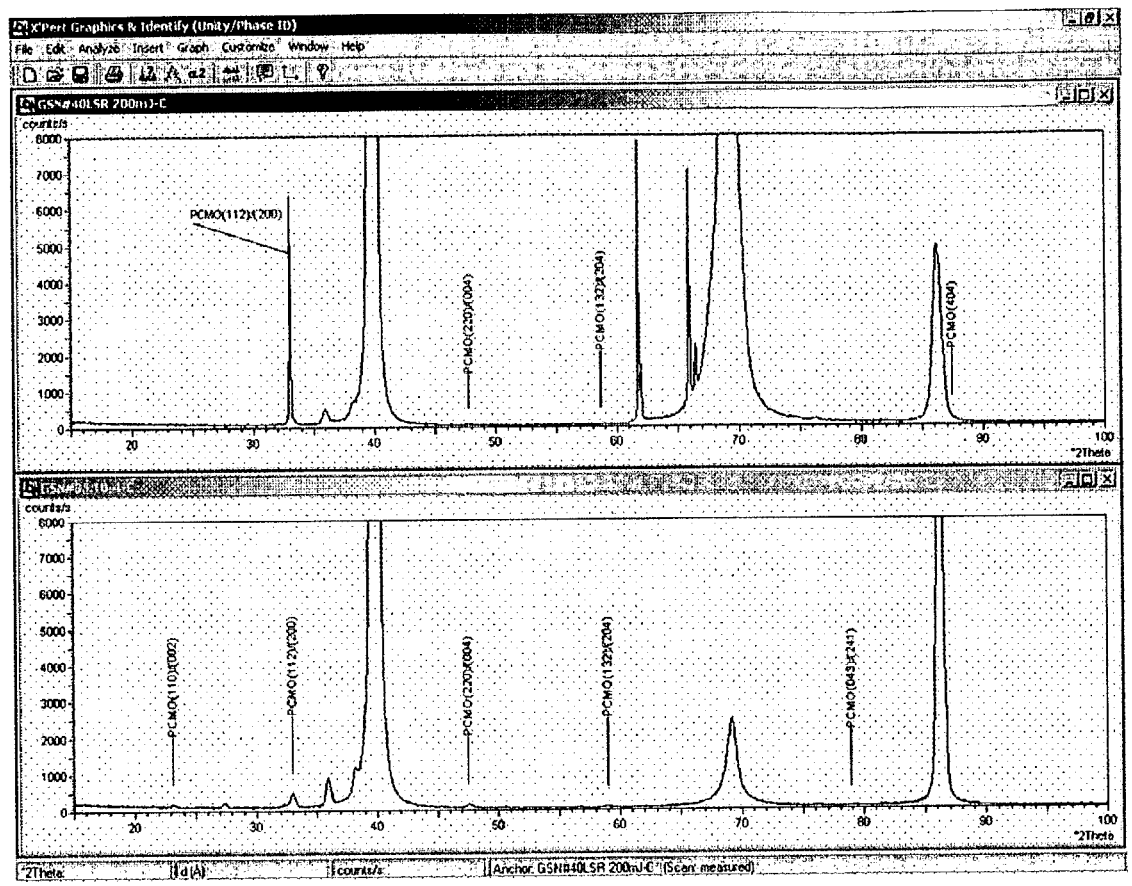
FIG. 10B shows XRD charts for laser annealed and thermal annealed PCMO film.

FIG. 10B shows X-ray diffraction data (XRD) charts for laser annealed (upper) and 1000° C. thermally annealed (lower) PCMO film. There is very strong peak at <112>/<200> orientation in the laser annealed film. The average grain size (otherwise known as the coherence length) is estimated by the Scherrer equation after deconvoluting the instrumental broadening. The Scherrer equation ignores the effects of strain broadening due to microstresses in the polycrystalline aggregate. The "grain size" estimated by x-ray diffraction is usually smaller than microscopic measurements, which depend on the accurate determination of grain boundaries.

As discussed above, laser annealing can be used to achieve low crystallization temperature (less than 400° C.) for PCMO and other conductive perovskite oxide materials.

Figure 11:
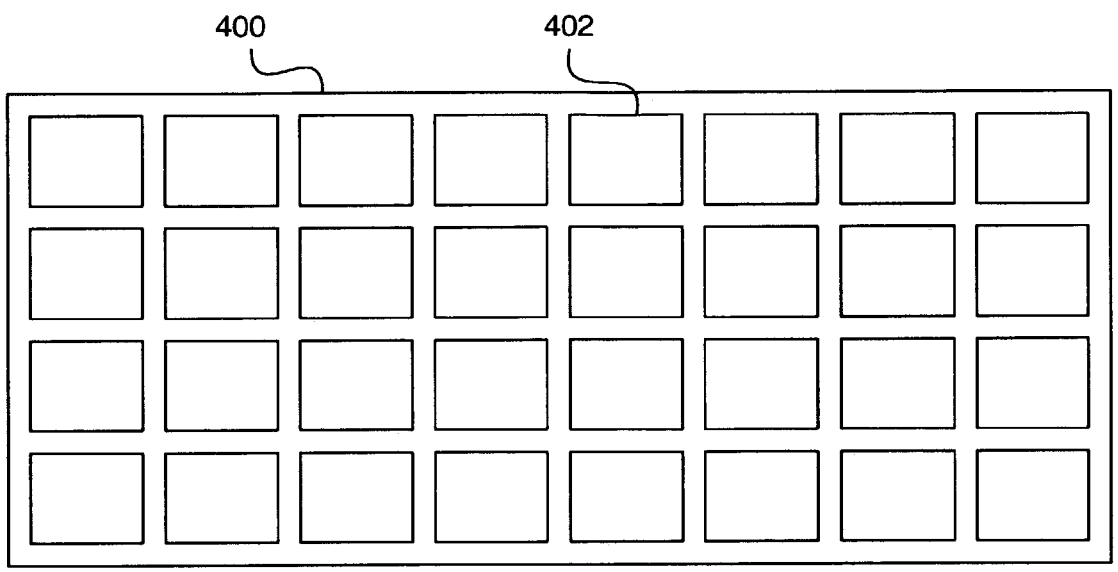
FIG. 11 shows an exemplary high density memory fabricated using the processes disclosed herein.

FIG. 11 shows an exemplary high density memory fabricated using the processes disclosed herein. The high density memory architecture has an array of memory devices where conductive lines are positioned perpendicular to one another in different metal layers. The place where the conductive lines intersect is called a cross-point. The cross point memory array includes X-select lines that cross Y-select lines. Memory cells are located at the cross points of the X and Y-select lines, and function as the storage elements of a memory array. The memory cells each store a binary state of either "1" or "0." A selected memory cell can have its binary state changed by applying write currents to the X-select line and the Y-select line that intersect at the selected memory cell. The binary state of a selected memory cell is read by applying a read voltage to the memory cell, and by measuring the resistance across the memory cell from the current passing through the memory cell.

Turning now to FIG. 11, a block diagram of an exemplary high-density memory 400 with 32 bit blocks is shown. A single bit block 402 contains substantially all the circuitry that would be required to store a single bit of information. Each bit block is responsible for a separate bit in a multi-bit address and provides a separate I/O operation. In this configuration, 32 bits could be accessed in a single cycle. Once a single bit block is designed, the same design can be replicated for each desired bit block.

The high-density memory 400 is preferably made up an array portion and a memory circuit portion. The memory circuit portion contains all of the active devices (devices that require a source of energy for their operation, such as transistors and amplifiers) needed to operate the high-density memory 400. The array portion includes a first layer of x-direction conductive array lines ($X_0$ layer), a second layer of x-direction conductive array lines ($X_1$ layer), a layer of y-direction conductive array lines ($Y_0$ layer), a first memory plug layer ($ML_0$) situated between the $X_0$ layer and the $Y_0$ layer, a second memory plug layer ($ML_1$) situated between the $Y_0$ layer and the $X_1$ layer, a first plurality of $X_0$ thrus and a first plurality of $X_1$ thrus. A plurality of vias and metallization layers together provide conductive paths from components of the memory circuit portion to memory cells of the array portion. Similarly, the thrus provide conductive paths from memory cells of the array portion to the memory circuit portion. It should be noted that the thrus of the array portion are conductive and, therefore, will have different electrical properties that the memory layers at the same height. More information on the memory device is disclosed in a co-pending, commonly owned application having Ser. No. 60/400,849, filed in Aug. 2, 2002 and entitled "HIGH-DENSITY NVRAM", the content of which is hereby incorporated by reference.

Figure 12:
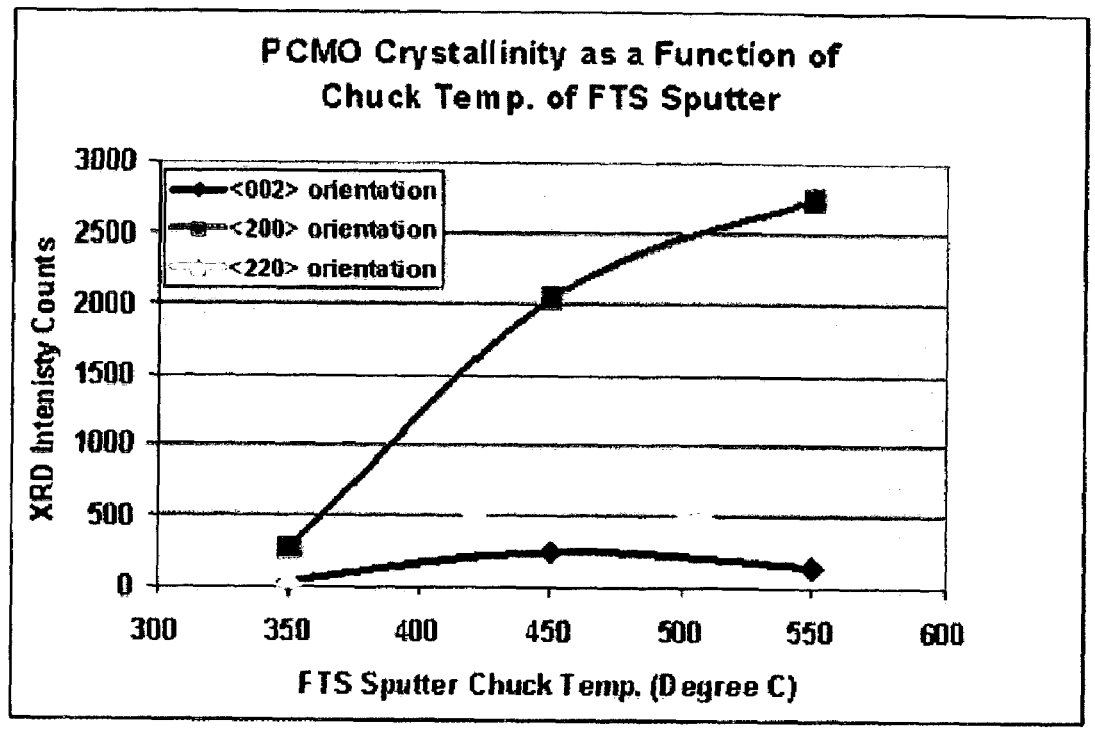
FIG. 12 is a chart illustrating in-situ crystallinity of PCMO film on a facing target sputtering (FTS) system.
Figure 13:
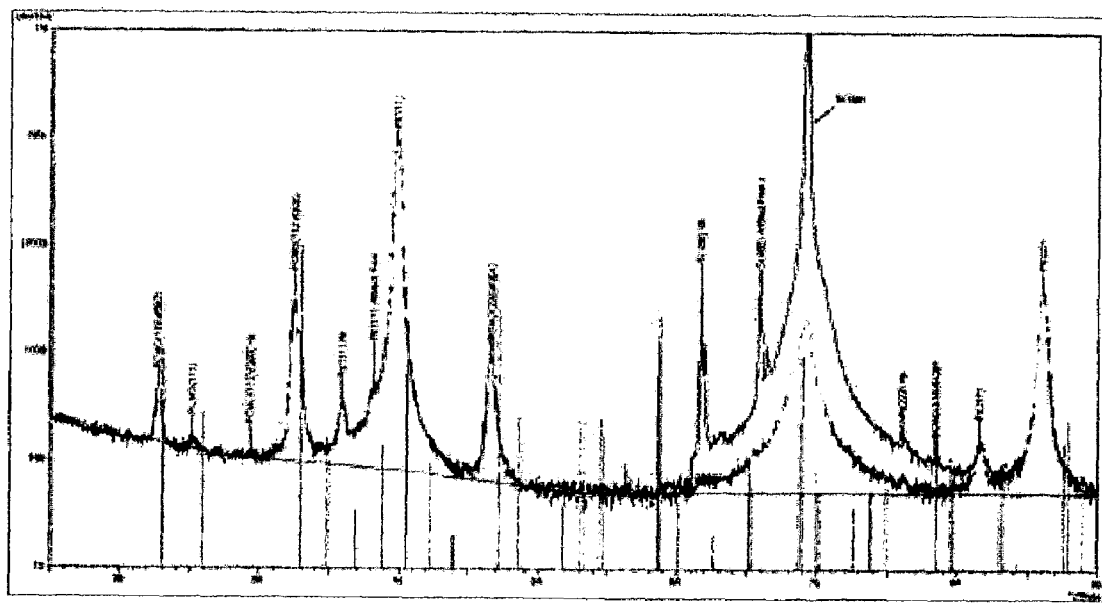
FIG. 13 is an X-ray Diffraction (XRD) pattern showing sputtered PCMO films show crystallinity effect at various temperatures.

FIG. 12 is a chart illustrating in-situ crystallinity of PCMO film on an FTS system, while FIG. 13 is an XRD pattern showing sputtered PCMO films with crystallinity at various temperatures. In FIG. 12, a 450C deposition is sufficient for achieving in-situ crystallinity of PCMO film on an FTS system. In FIG. 13, both 450° C. and 550° C. sputtered PCMO films show crystallinity. The FTS system provides high mobility of atoms because of the confined dense plasma resulting in large kinetic energy of sputtered atoms. The substrate is outside the plasma, resulting in a plasma free deposition surface and a high quality film. As XRD data shown in FIG. 12 and FIG. 13, PCMO preferred orientation is achieved in <200>/<112> on <111> Pt substrate using FTS sputtering. The crystal growth in <200>/<112> orientation is a strong function of sputtering temperature. The in-situ crystallinity formation temperature can be further reduced to 400° C. and less by using conductive metal oxide or conductive perovskite material as a seed layer.

The storage memory can be used as replacement memory for PROM (programmable read-only memory), EPROM (electrically programmable read-only memory), EEPROM (electrically erasable programmable read-only memory), FRAM (Ferroelectric Random Access Memory), NVRAM (Non-Volatile Random Access Memory), Bubble Memory, and Flash Memory. The memory can also be used in programmable switches such as field programmable gate arrays (FPGAs). Typically, a field programmable gate array (FPGA) has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

It is to be understood that various terms employed in the description herein are interchangeable. Accordingly, the above description of the invention is illustrative and not limiting. Further modifications will be apparent to one of ordinary skill in the art in light of this disclosure.

The invention has been described in terms of specific examples which are illustrative only and are not to be construed as limiting. The invention may be implemented in digital electronic circuitry or in computer hardware, firmware, software, or in combinations of them.

Apparatus of the invention for controlling the fabrication equipment may be implemented in a computer program product tangibly embodied in a machine-readable storage device for execution by a computer processor; and method steps of the invention may be performed by a computer processor executing a program to perform functions of the invention by operating on input data and generating output. Suitable processors include, by way of example, both general and special purpose microprocessors. Storage devices suitable for tangibly embodying computer program instructions include all forms of non-volatile memory including, but not limited to: semiconductor memory devices such as EPROM, EEPROM, and flash devices; magnetic disks (fixed, floppy, and removable); other magnetic media such as tape; optical media such as CD-ROM disks; and magneto-optic devices. Any of the foregoing may be supplemented by, or incorporated in, specially-designed application-specific integrated circuits (ASICs) or suitably programmed field programmable gate arrays (FPGAs).

While the preferred forms of the invention have been shown in the drawings and described herein, the invention should not be construed as limited to the specific forms shown and described since variations of the preferred forms will be apparent to those skilled in the art. Thus the scope of the invention is defined by the following claims and their equivalents.

What is claimed is:

1. A memory fabrication apparatus comprising:
   a. a pair of targets arranged so as to be spaced apart from one another within a closed vacuum vessel, each target of said pair of targets having a sputtering surface facing the sputtering surface of the other target of said pair of targets; and
   b. a substrate holder adapted to receive facing target sputtering a complex metal oxide (CMO) material on an electrode wherein the CMO material is adapted to operate within a cross point memory array and the CMO material is deposited on circuitry.

2. The apparatus of claim 1, wherein the CMO material comprises a manganite, titanate or zirconate.

3. The apparatus of claim 1, wherein the CMO material is a perovskite.

4. The apparatus of claim 1, wherein the CMO material is a non-perovskite.

5. The apparatus of claim 4, wherein the CMO material is deposited at a temperature above 350° C.

6. The apparatus of claim 5, wherein the CMO material is deposited at a temperature below 550° C.

7. The apparatus of claim 1, wherein the electrode comprises a metal or a conductive metal oxide.

8. The apparatus of claim 1, wherein the electrode comprises a diffusion barrier.

9. The apparatus of claim 1, wherein the electrode comprises a plug.

10. The apparatus of claim 1, wherein the CMO material is adapted to operate within an array of memory cells capable of storing at least a Megabit of information, each memory cell including a memory plug that includes a memory element that switches from a first resistance state to a second resistance state upon application of a first write voltage of a first polarity and reversibly switches from the second resistance state to the first resistance state upon application of a second write voltage of polarity opposite to the first polarity.

11. The apparatus of claim 1, wherein the CMO material is crystalline.

12. The apparatus of claim 1, wherein the CMO material is a polycrystalline structure, wherein the polycrystalline structure comprises a small grain size.

13. The apparatus of claim 12, wherein the small grain size is approximately 0.1 micron or less.

14. The apparatus of claim 1, wherein the CMO material comprises a conductive metal oxide material on the electrode.

15. The apparatus of claim 1, wherein the CMO material comprises a manganite.

16. The apparatus of claim 1, wherein the CMO material comprises a titanate.

17. The apparatus of claim 1, wherein the CMO material comprises a zirconate.

18. The apparatus of claim 1, wherein the vacuum vessel comprises an ambient environment for annealing.

19. The apparatus of claim 18, wherein the ambient environment comprises nitrogen.

20. The apparatus of claim 18, wherein the ambient environment comprises argon.

21. A memory fabrication apparatus, comprising:
   a. a pair of targets arranged so as to be spaced apart from one another within a closed vacuum vessel, each target of said pair of targets having a sputtering surface facing the sputtering surface of the other target of said pair of targets; and
   b. a substrate holder adapted to receive facing target sputtering a complex metal oxide (CMO) material on an electrode;
   wherein a memory resulting from the memory fabrication apparatus switches from a first resistance state to a second resistance state upon application of a first write voltage of a first polarity and reversibly switches from the second resistance state to the first resistance state upon application of a second write voltage of polarity opposite to the first polarity, wherein the CMO material is deposited on circuitry.

22. A semiconductor fabrication process, comprising:
   a. providing at least a pair of facing targets arranged so as to be spaced apart from one another within a closed vacuum vessel, each target of said pair of targets having a sputtering surface facing the sputtering surface of the other target of said pair of targets; and
   b. sputtering a CMO memory material on an eletrode, wherein the CMO memory material is adapted to operate within a cross point memory array and the CMO memory material is deposited on circuitry.

23. The process of claim 22, wherein the electrode comprises a metal or a conductive metal oxide.

24. The process of claim 22, wherein the electrode comprises a diffusion barrier.

25. The process of claim 22, the electrode comprises a plug.

26. The process of claim 22, wherein the CMO memory material comprises a manganite, a titanate or a zirconate.

27. The process of claim 22, wherein the CMO material is a perovskite.

28. The process of claim 22, wherein the CMO material is a non-perovskite.

29. The process of claim 22, wherein the CMO material is deposited at a temperature below 375° C.

30. The process of claim 22, wherein the CMO material comprises a polycrystalline structure.

31. A semiconductor fabrication process, comprising:
   a. providing a pair of targets arranged so as to be spaced apart from one another within a closed vacuum vessel, each target of said pair of targets having a sputtering surface facing the sputtering surface of the other target of said pair of targets;
   b. applying an electric power to said pair of targets to cause sputtering from the sputtering surface of each target of said pair of targets;
   c. generating at least a perpendicular magnetic field extending in a direction perpendicular to said sputtering surfaces to confine plasma-in a space between said sputtering surfaces; and
   d. face target sputtering a CMO memory material on an eletrode, wherein the CMO memory material is adapted to operation within a cross point memory array and the CMO memory material is deposited on circuitry.

32. The process of claim 31, wherein the CMO memory material comprises a polycrystalline structure.

33. The process of claim 32, wherein the CMO memory material comprises a manganite.

34. The process of claim 32, wherein the CMO memory material comprises a rare earth metal and an alkaline earth metal.

35. The process of claim 32, wherein the CMO memory material comprises a zirconate.

36. The process of claim 32, wherein the CMO memory material comprises a titanate.

* * * * *